United States Patent [19]

Takeuchi et al.

[11] 4,007,417
[45] Feb. 8, 1977

[54] THIN FILM MAGNETOMETER USING AN ORTHOGONAL FLUX GATE

[75] Inventors: Shinjiro Takeuchi; Satoshi Ichioka; Masaki Shirosaka, all of Toda; Tadashi Inoue, Tokyo, all of Japan

[73] Assignee: Mishima Kosan Co., Ltd., Kitakyushu, Japan

[22] Filed: June 14, 1974

[21] Appl. No.: 479,573

Related U.S. Application Data

[63] Continuation-in-part of Ser. No. 319,707, Dec. 29, 1972, abandoned.

[30] Foreign Application Priority Data

Oct. 2, 1972 Japan .............................. 47-98833

[52] U.S. Cl. ......................................... 324/43 R
[51] Int. Cl.² ...................................... G01R 33/04
[58] Field of Search ........................... 324/43 R, 47

[56] References Cited

UNITED STATES PATENTS

| 2,543,843 | 3/1951 | Frosch .............................. 324/43 R |
| 2,752,564 | 6/1956 | Ryerson ............................ 324/43 R |
| 2,870,270 | 1/1959 | Nagai et al. ...................... 324/43 R |
| 2,942,180 | 6/1960 | Coker ............................... 324/43 R |
| 3,239,754 | 3/1966 | Odom, Jr. et al. ................ 324/47 |
| 3,718,872 | 2/1973 | Takeuchi .......................... 324/43 R |

FOREIGN PATENTS OR APPLICATIONS 611,194  12/1960  Canada ............................ 324/43 R

OTHER PUBLICATIONS

Oshima et al, High Sensitivity Plated–Wire Senor, AEEE Trans. on Mag., Sept. 1971, pp. 436–437.

Primary Examiner—Robert J. Corcoran
Attorney, Agent, or Firm—Wenderoth, Lind & Ponack

[57] ABSTRACT

The orthogonal flux gate thin film magnetometer comprising an orthogonal flux gate utilizing a rotation magnetization mechanism consisting of a sensing coil wound on a plated wire formed by applying to a conductor a ferromagnetic thin film, an alternating excitation power means for exciting the thin film of the flux gate, an amplitude difference detection circuit means for detecting a difference between positive and negative asymmetrical peak values of the output voltage of the flux gate, and a control means for feedback of the output of the detection circuit to the sensing coil of the flux gate through a feedback circuit and for supplying the output of the control means to an indicating means. The magnitude and the polarity of the external magnetic field are sensed from the feedback current which erases the external magnetic field applied to the flux gate.

1 Claim, 12 Drawing Figures

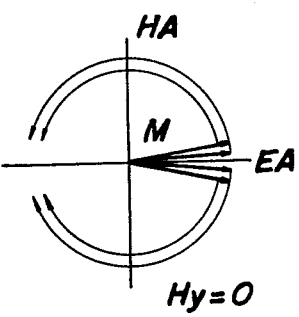
FIG_1a
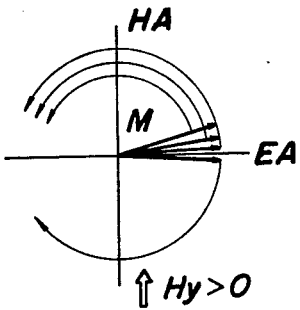
FIG_1b
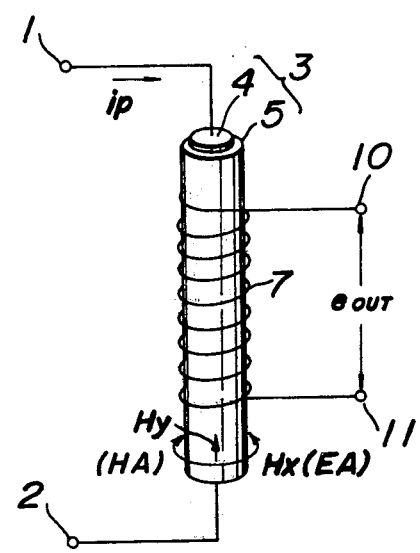
FIG_2
FIG_3a  FIG_3b  FIG_3c
$Hy = 0(Oe)$   $Hy = 0.05(Oe)$   $Hy = 0.1(Oe)$
$Hy = 0.25(Oe)$   $Hy = 0.5(Oe)$   $Hy = 1.0(Oe)$
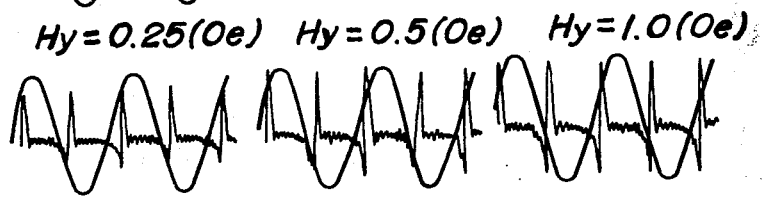
FIG_3d  FIG_3e  FIG_3f

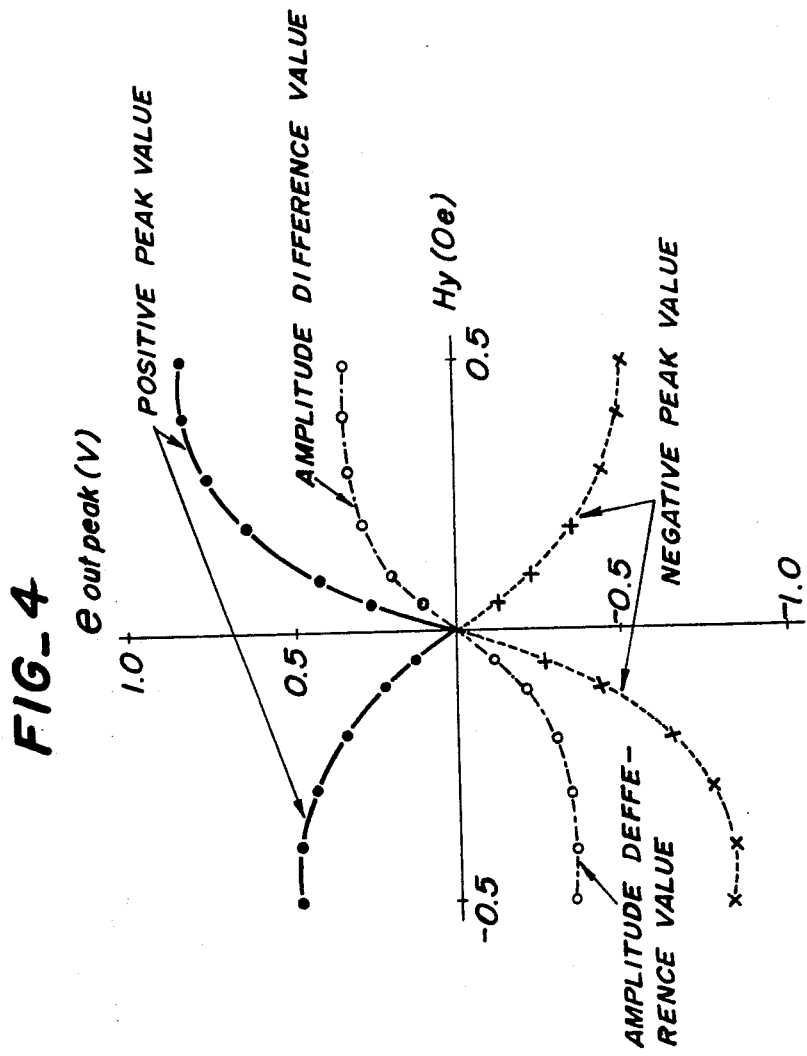

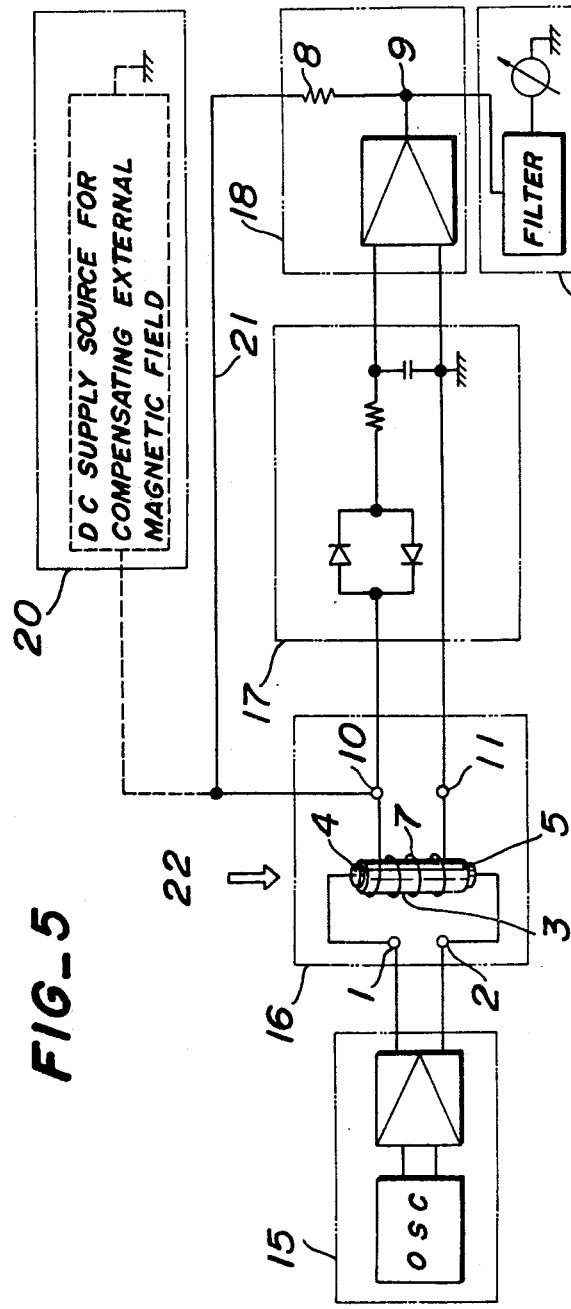
FIG_5
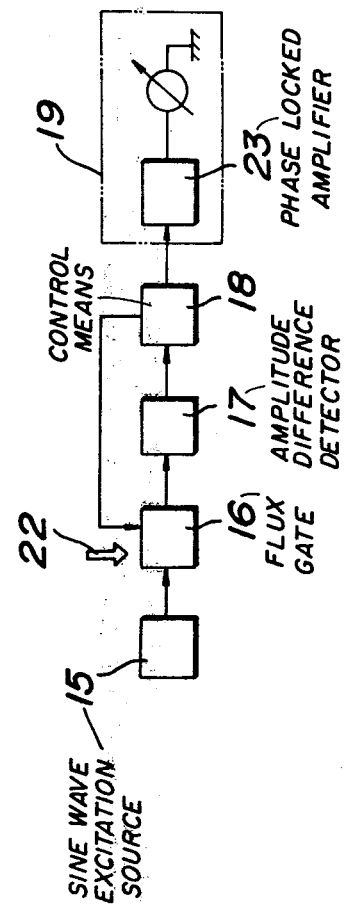
FIG_6

THIN FILM MAGNETOMETER USING AN ORTHOGONAL FLUX GATE

BACKGROUND OF THE INVENTION

This application is a continuation-in-part of the application Ser. No. 319,707 filed Dec. 29, 1972, now abandoned.

The present invention relates to a thin film magnetometer using an orthogonal flux gate for sensing and measuring the magnitude and the polarity of an external magnetic field.

A conventional orthogonal flux gate magnetometer utilizes a bulk-shaped magnetic material as a sensing element, so that means for increasing an excitation frequency is used to improve the frequency response and the detection sensitivity resulting in an increase of the eddy current loss.

In order to solve this problem it has been proposed that the magnetic material be used in the form of an insulated and laminated layer. However, in such a magnetic material the flux reversal of domain wall motion is great so that the switching speed for the magnetic material is very slow and the excitation frequency is limited to a range of several 10 Hz to several 10 KHz.

SUMMARY OF THE INVENTION

An object of the present invention is to eliminate the above described defects and the inherent limitations of the conventional device by adopting an over excitation condition in order that the flux reversal of domain rotation becomes great and the switching speed and the frequency response become very rapid.

Another object of the invention is to provide a small and light weight orthogonal flux gate thin film magnetometer comprising a sensing coil and a plated wire which has uniaxial anisotropy.

The orthogonal flux gate thin film magnetometer according to the present invention comprises a source of an excitation current having a sine waveform, an orthogonal flux gate, an amplitude difference detection circuit means for detecting a difference between positive and negative peak voltage values, a feedback circuit, control means for feeding back the output of the detection circuit to a sensing coil of the flux gate through the feedback circuit, and indicating means for producing an indication of a sensed magnetic field. The magnitude and polarity of the external magnetic field are sensed from the feedback current. The feedback current also erases the external magnetic field applied to the flux gate.

The present invention is characterized by the use of an excitation current having a sine waveform to excite the flux gate composed of magnetic material and an electrodeposited or plated thin film having a multimagnetic domain construction in which each magnetization is dispersed within a range of several degrees around the mean easy magnetization axis in a Gaussian distribution so as to produce a difference between the positive and negative asymmetrical peak values corresponding to the external magnetic field in the output voltage of the flux gate.

BRIEF DESCRIPTION OF THE FIGURES

FIG. 1a shows the behaviour of magnetization of the thin film having a plurality of domains in the case of Hy=0;

FIG. 1b shows the behaviour of magnetization of the thin film having a plurality of domains in the case of Hy>0;

FIG. 2 is a perspective view of an orthogonal flux gate having a plurality of domains used in the magnetometer according to the present invention;

FIGS. 3a to 3f are graphs showing the output voltage corresponding to the external magnetic field and the driving current;

FIG. 4 is a graph showing the relation between the peak value of the output voltage and the external magnetic field;

FIG. 5 is a block diagram showing an embodiment of the orthogonal flux gate thin film magnetometer according to the present invention;

FIG. 6 is a block diagram showing a second embodiment of the orthogonal flux gate thin film magnetometer according to the present invention.

DESCRIPTION OF PREFERRED EMBODIMENT

The magnetometer according to the invention uses a magnetic thin film, so that its eddy current loss is less than that of a bulk magnetic material.

In the invention, the first half magnetization reversal speed in magnetization reversion is more retarded than the last half magnetization reversal speed because an oxcilation current having a sine waveform is used. As a result, there is generated a difference between positive and negative peak values having a waveform of a multifrequency output voltage. The intensity of an external magnetic field corresponds to a peak value of the output voltage since the plated wire has a multimagnetic domain construction with easy magnetization axis in a Gaussian distribution. The voltage value of the waveform of this output voltage peak value difference and its sign correspond to the intensity of an internal magnetic field and its polarity. Therefore, in the invention, the measurement of the external magnetic field is made possible by detection of the amplitude difference of the output voltage. The invention utilizes flux reversal of domain rotation for obtaining a waveform having a positive-negative asymmetrical multifrequency output voltage and for increasing the frequency response. In order to carry out the above objects, the maximum value of the sine wave excitation magnetic field for exciting the magnetic thin film is made sufficiently larger than the rotational coercive force. An electrodeposited magnetic thin film used in the invention consists of a plurality of magnetic domains, so that the easy magnetization axis of each magnetic domain is dispersed within the range of several degrees around a mean easy magnetization axis (EA). Accordingly, the amplitude value of the multifrequency output voltage can be determined by the difference between the number of magnetic domains having the magnetization rotated in the clockwise direction and the number of magnetic domains having the magnetization rotated in the counterclockwise direction. The magnetometer according to the invention by positively utilizing such a phenomenon is provided with a control means for erasing an external magnetic field added to the magnetic thin film in order to prevent that every magnetic domain is not rotated in the clockwise direction or counterclockwise direction.

In the present invention, the magnetic thin film is a closed magnetic path for the excitation magnetic field for efficiently exciting the magnetic thin film.

FIGS. 1a and 1b show behaviours of magnetization M in a magnetic thin film having a multimagnetic domain construction. If there is no external magnetic field Hy (FIG. 1a), each magnetization M is dispersed within the range of several degrees around the mean easy magnetization axis EA in a Gaussian distribution because of the multimagnetic domain construction.

Accordingly, the rotational direction of each magnetization M is classified into the clockwise direction and the counterclockwise direction, and the number of magnetic domains rotated in each direction becomes equal. As a result, different from the case shown in FIG. 1, the output voltage induced in the sensing cool for detecting the flux change in the hard magnetization axis HA direction becomes zero. In other words, in the case that the external magnetic field is Hy>0 (FIG. 1b), the number of the magnetic domains having the magnetization rotated in the counterclockwise direction in the negative half cycle of the excitation magnetic field becomes more than the number of the magnetic domains having the magnetization rotated in the clockwise direction, and the output voltage corresponding to the number of the magnetic zones thereof can be observed. The excitation condition according to the present invention is an over-excitation due to the sinusoidal excitation current so that during a half cycle of the excitation current the peak value of the output voltage becomes small because of slow rotating speed of magnetization at the first half of the reversal thereof and then large because the first rotating speed of magnetization at the latter half of the reversal thereof in a zero rotating speed at the end of the reverse of magnetization.

FIG. 2 shows the fundamental construction of an orthogonal flux gate with the use of the magnetic thin film having a plurality of domains according to the invention. This construction is a fundamental magnetic sensing element in the invention. An excitation current $i_p$ for generating the sine wave excitation magnetic field is flowed between conductor terminals 1 and 2 connected to opposite end portions of a magnetic wire or a plated wire 3. The plated wire 3 consists of a magnetic thin film 5 (about $1\mu$ thick) having a uniaxial anisotropy in the circumferential direction electrodeposited on a core conductor 4. The magnetic thin film 5 having a plurality of domains is made of a magnetic material having high permeability. A sensing coil 7 of the orthogonal flux gate is wound around the plated wire 3 and both terminals 10 and 11 of the sensing coil 7 are used as output terminals.

FIGS. 3a to 3f show actually measured waveforms of a multifrequency output voltage $e_{out}$ observed when a sine wave current of 1 MHz is flowed between the terminals 1 and 2 of the orthogonal flux gate shown in FIG. 5. It is understood that as the external magnetic field Hy becomes larger, the amplitude value of the multifrequency output voltage $e_{out}$ becomes larger. Further, it is apparent that the multifrequency output voltage $e_{out}$ becomes a postive-negative asymmetrical waveform.

FIG. 4 shows actually measured data of each peak value and a difference of peak values of the multifrequency output voltage of the flux gate shown in FIG. 2. Even if the external magnetic field is measured from the amplitude value of the multifrequency output voltage, when a common detecting means (for example halfwave rectification) is used, a curve formed by continuous positive peak values shown in the figure is obtained, so that it is impossible to detect polarity of the external magnetic field, and even if the absolute value of the external magnetic field is the same, the indicating value of the detected output becomes different due to polarity of the external magnetic field.

In addition, if the multifrequency output voltage is full-wave rectified, polarity of the external magnetic field cannot be detected.

In the invention, the difference between the positive peak value and negative peak value of the multifrequency output voltage $e_{out}$ is detected, and the intensity of the external magnetic field and polarity thereof are detected by the value of the amplitude difference voltage and the sign thereof.

FIG. 5 shows a fundamental constructional view of the invention.

In FIG. 5, the reference 15 is a sine wave excitation current source for exciting the magnetic thin film 5 and consists of an oscillator OSC and a current amplifier. The reference 16 is an orthogonal flux gate, i.e., the magnetic field sensing element of the invention which is explained in FIG. 2. When the sine wave excitation current is flowed between the terminals 1 and 2, the multifrequency output voltage $e_{out}$ is observed between output terminals 10 and 11. If the multifrequency output voltage $e_{out}$ is amplitude difference modulated by an external magnetic field 22, the amplitude difference voltage of $e_{out}$ can be taken out. The reference 17 is an amplitude difference detection means and its main construction consists of diodes for detecting the amplitude difference and a smoothing circuit. The value of the output voltage detected by the detection means 17 and the sign thereof corresponding to the intensity of the external magnetic field 22 and the polarity thereof.

However, as understood from FIG. 4, when the external magnetic field Hy becomes more than about $0.40e$, there is no longer a change of the amplitude value of the multifrequency output voltage $e_{out}$, and as a result, the external magnetic field cannot be measured. This is due to the fact that each magnetic domain in the magnetic thin film 5 is rotated in the same direction. Therefore, if an erasing magnetic field for erasing the external magnetic field Hy is added from a direction entirely different from the direction of the external magnetic field Hy acting on the magnetic thin film 5, the range of measurement of the magnetic field is extended.

Reference numeral 18 is a control means for attaining the above object and consists of a current amplifier and a negative feedback resistor 8 which is connected between the terminal 10 of the orthogonal flux gate and the terminal 9 of the current amplifier.

Reference numeral 21 is a conductor constituting a negative feedback circuit.

An erasing current flowed through the negative feedback resistor 8 passes into the terminal 10 of the sensing coil 7 and flows to the terminal 11 through the ground. At this time, an erasing magnetic field is generated by the erasing current flowing through the sensing coil 7 so as to erase the external magnetic field applied to the magnetic thin film 5. In this case, the intensity and polarity of the external magnetic field can be detected by the magnitude and polarity of the erasing current, and the range for measuring the magnetic field is very greatly increased.

Reference numeral 19 is an indicating means, mainly consisting of a filter and a current meter.

Reference numeral 20 is a variable DC current source for erasing the external magnetic field 22.

This DC current source 20 can be used when a micromagnetic field superimposed on the strong external magnetic field 22 is only detected.

The construction shown in FIG. 6 is effective when used in case that the external magnetic field 22 is an alternating magnetic field.

Reference numeral 23 in the figures is a conventional phase locked amplifier having the function of amplifying an AC component by fixing a phase. Therefore, the alternating magnetic field can be detected with high sensitivity. Corresponding circuits shown in FIG. 6 have the same reference numerals and the same junction as in FIG. 5.

What is claimed:

1. A thin film magnetometer utilizing an orthogonal flux gate and a rotation magnetization mechanism, comprising:

an orthoganol flux gate comprised of a plated wire having a ferromagnetic material thin film having thereon a multimagnetic domain structure with the easy magnetization axis of the respective magnetic domains in a Gaussian distribution within a range of several degrees around the mean easy magnetization axis and a sensing coil wound on said plated wire, said plated wire and said coil being a magnetic sensing element;

a current source having a sine waveform and coupled to the ends of said plated wire for exciting the ferromagnetic thin film thereon;

an amplitude difference detection circuit means coupled to the said sensing coil for detecting an difference between the positive and negative peak voltage values of the output of said sensing coil and producing an output indicative thereof;

control means operatively connected to the output of said amplitude difference detecting circuit means for producing an erasing current sufficient to erase the magnetic field at said flux gate; a feedback circuit having one end thereof coupled to the output of said control means for feeding back the output of said detection circuit means to said sensing coil;

indicating means consisting of a phase locked amplifier and an ammeter and coupled to the output of said control means and producing an indication of a sensed magnetic field, and a DC current source connected to said flux gate for generating a magnetic field for erasing an external magnetic field unnecessary for measurement, whereby a micromagnetic field superimposed on an external magnetic field can be measured.

* * * * *